(12) United States Patent
Ma et al.

(10) Patent No.: US 8,079,013 B1
(45) Date of Patent: Dec. 13, 2011

(54) HARDWARE DESCRIPTION INTERFACE FOR A HIGH-LEVEL MODELING SYSTEM

(75) Inventors: Haibing Ma, Superior, CO (US); Jingzhao Ou, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 321 days.

(21) Appl. No.: 12/340,473

(22) Filed: Dec. 19, 2008

(51) Int. Cl.
*G06F 17/50* (2006.01)

(52) U.S. Cl. ........ 716/139; 716/102; 716/106; 716/110; 716/118; 716/126; 703/2; 703/13; 703/19

(58) Field of Classification Search .................. 716/101, 716/102, 104, 106, 118, 119, 139, 110, 116, 716/126–131; 703/19, 2, 13
See application file for complete search history.

(56) References Cited

U.S. PATENT DOCUMENTS

| | | | |
|---|---|---|---|
| 6,477,691 B1 * | 11/2002 | Bergamashi/Rab et al. ... | 716/104 |
| 7,003,751 B1 | 2/2006 | Stroomer et al. | |
| 7,086,014 B1 * | 8/2006 | Bartz et al. .................... | 716/102 |
| 7,143,369 B1 * | 11/2006 | Milne ............................ | 716/102 |
| 7,203,632 B2 * | 4/2007 | Milne et al. ..................... | 703/14 |
| 7,203,922 B2 * | 4/2007 | Hamilton et al. ............. | 716/102 |
| 7,415,689 B2 * | 8/2008 | Taylor ........................... | 716/101 |
| 7,509,246 B1 * | 3/2009 | Molson et al. .................. | 703/13 |
| 2007/0157138 A1 * | 7/2007 | Ciolfi et al. ....................... | 716/4 |
| 2007/0245294 A1 * | 10/2007 | Saito et al. .................... | 717/100 |
| 2008/0209380 A1 * | 8/2008 | Hattori et al. ................... | 716/10 |
| 2010/0107130 A1 * | 4/2010 | Bowers et al. .................... | 716/5 |

OTHER PUBLICATIONS

Per Haglund, Oskar Mencer, Wayne Luk, and Benjamin Tai, "Hardware Design with a Scripting Language," in *Proceedings of International Conference on Field-Programmable Logic and its applications (FPL)*, 2003, pp. 1040-1043.
David Castells-Rufas, and Jordi Carrabina, "Jumble: A Hardware-in-the-Loop Simulation System for JHDL," in *Proceedings of IEEE Symposium on Field-Programmable Custom Computing Machines (FCCM)*, 2007, 2 pages.
Jingzhao Ou, Viktor K. Prasanna, "PyGen: A MATLAB/Simulink Based Tool for Synthesizing Parameterized and Energy Efficient Designs Using FPGAs," in *Proceedings of IEEE Symposium on Field-Programmable Custom Computing Machines (FCCM)*, 2004, 10 pages.
Peter Bellows and Brad Hutchings, "JHDL—An HDL for Reconfigurable Systems," in *Proceedings of IEEE Symposium on Field-Programmable Custom Computing Machines (FCCM)*, 1998, 10 pages.
U.S. Appl. No. 12/697,881, filed Feb. 1, 2010, Chan et al.

(Continued)

*Primary Examiner* — Paul Dinh
*Assistant Examiner* — Nha Nguyen
(74) *Attorney, Agent, or Firm* — Kevin T. Cuenot

(57) ABSTRACT

A computer-implemented method of specifying a circuit design within a high-level modeling system (HLMS) can include, responsive to a scripted user input, instantiating a first and a second block objects within a hardware description interface (HDI) that is communicatively linked with the HLMS and, responsive to instantiating the first and second block objects, creating and displaying, within the HLMS, first and second modeling blocks representing the first and second xBlock objects respectively. Responsive to instantiating, within the HDI, a signal object bound to an output port of the first block object and an input port of the second block object, a modeling line can be created and displayed within the HLMS visually linking an output of the first modeling block with an input of the second modeling block. The first modeling block, second modeling block, and modeling line can be stored as a description of the circuit design.

18 Claims, 4 Drawing Sheets

OTHER PUBLICATIONS

U.S. Appl. No. 12/622,327, filed Nov. 19, 2009, Szedo.
Bellows, Peter et al., "JHDL—An HDL for Reconfigurable Systems," *Proc. of the 6th Annual IEEE Symposium on Field-Programmable Custom Computing Machines (FCCM)*, Apr. 15, 1998, pp. 175-184, IEEE Computer Society, Washington, DC, USA.
Castells-Rufas, David et al., "Jumble: A Hardware-in-the-Loop Simulation System for JHDL," *Proc. of the 15th Annual IEEE Symposium on Field-Programmable Custom Computing Machines (FCCM)*, Apr. 23, 2007, pp. 345-348, IEEE Computer Society, Washington, DC, USA.
Haglund, Per et al., "Hardware Design with a Scripting Language," *Proc. of the 13th International Conference on Field-Programmable Logic and Applications (FPL)*, Sep. 1, 2003, pp. 1040-1043, Springer Publishing Company, New York, New York.
Ou, Jingzhao et al., "PyGen: A MATLAB/Simulink Based Tool for Synthesizing Parameterized and Energy Efficient Designs Using FPGAs," *Proc. of the 12th Annual IEEE Symposium on Field-Programmable Custom Computing Machines (FCCM)*, Apr. 23, 2004, pp. 47-56, IEEE Computer Society, Washington, DC, USA.
Mentor Graphics, Catapult C Synthesis User's and Reference Manual, University Version, Release 2010a Update 1, Nov. 2010, pp. 1-673.
Mentor Graphics, ModelSim PE, Simulation and Verification, Datasheet, MGC-5-05, 1023770-w, 2005, 2 pp.
Mentor Graphics, ModelSim SE, Simulation and Verification, Datasheet, MGC-5-06, 1025020-w, 2006, 3 pp.
Xilinx, Inc., System Generator for DSP, Reference Guide, Release 10.1, Mar. 2008, 1-518 pp., Xilinx, Inc., 2100 Logic Drive, San Jose, CA 95124.
Xilinx, Inc., System Generator for DSP, User Guide, Release 10.1, Mar. 2008, 1-350 pp., Xilinx, Inc., 2100 Logic Drive, San Jose, CA 95124.
Xilinx, Inc., ISim User Guide, UG 660 (v. 13.1), Mar. 18, 2011, 1-196 pp., Xilinx, Inc., 2100 Logic Drive, San Jose, CA 95124.
Xilinx, Inc., Xilinx System Generator for v2.1 for Simulink Introduction Tutorials, Xilinx System Generator v2.1 Basic Tutorial, Jun. 7, 2001, 1-56 pp., Xilinx, Inc., 2100 Logic Drive, San Jose, CA 95124.

* cited by examiner

HARDWARE DESCRIPTION INTERFACE FOR A HIGH-LEVEL MODELING SYSTEM

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The embodiments disclosed herein relate to high-level modeling systems for development of circuit designs on integrated circuit devices (ICs). More particularly, the embodiments relate to providing a hardware description interface for a high-level modeling system.

BACKGROUND

A high-level modeling system (HLMS) facilitates circuit design through high-level abstraction of low-level hardware, e.g., circuit components and intellectual property (IP) cores. Generally, an IP core refers to a pre-designed, programmatic description of hardware that performs a particular function. The IP core can be specified as a hardware description language file or files, as a bitstream that programs a programmable integrated circuit device (IC), whether fully or partially programmable, as a netlist, or the like. Alternatively, an IP core can include source code or schematics that describe the logic and connectivity of a portion of a circuit design. Typical IP cores can provide, but are not limited to, digital signal processing (DSP) functions, memories, storage elements, math functions, etc. Some IP cores include an optimally floor-planned layout targeted to a specific family of ICs. Cores can also be parameterizable in that the user may enter parameters to activate or change certain functionality of the IP core.

One benefit of a HLMS is the graphical design environment provided for circuit designers, e.g., users. Working within a HLMS, a user may simply drag and drop various graphical blocks from a library of such blocks into the design environment of the HLMS. Each graphical block represents a high-level modeling block that is representative of a circuit function, e.g., an adder or a multiplier. The user may graphically create wires linking the graphical blocks as well as manually position the graphical blocks within the HLMS design environment using a pointer device.

Once the circuit design is visually created within the HLMS design environment, the user may simulate various aspects of the circuit design, e.g., timing, directly within the HLMS. Additionally, the HLMS may generate any of a variety of different programmatic descriptions for use in implementing the circuit design within an IC. For example, the HLMS may translate the high-level circuit description used natively within the HLMS, e.g., the collection of modeling blocks, into a hardware description language (HDL) formatted circuit description, a netlist, a bitstream that can program a programmable IC, whether fully or partially programmable, or another low-level hardware implementation.

The graphical user interface (GUI) provided by many HLMSs offers several advantages. One advantage is that the drag-and-drop manner in which modeling blocks are added to a system and positioned is straightforward and intuitive for hardware engineers. Graphical representations of circuit designs also facilitate debugging since a user may examine data flowing across graphical blocks. For example, input ports and/or output ports of the system may be graphically linked to data analysis blocks to facilitate cycle-accurate observation of selected signals within the circuit design being modeled.

Unfortunately, GUIs are not scalable when designing very large, complex systems. Such systems may contain thousands of blocks, making graphical design cumbersome and, in some cases, unmanageable as the user is left having to manually and graphically drag each desired modeling block into the HLMS design environment. Additionally, parameterized designs do not lend themselves to graphical design. Within a parameterized design, the number of modeling blocks and the connections between the modeling blocks can change according to the different parameters that may be used. The graphical design environment provided by a HLMS may actually limit the user's ability to fully exploit parameterizable IP cores by making it cumbersome to explore different design and parameterization possibilities.

SUMMARY

The embodiments disclosed herein relate to implementation of circuit designs within a high-level modeling system (HLMS). One embodiment of the present invention can include a computer-implemented method of specifying a circuit design within a HLMS. The method can include, responsive to a user input, instantiating a first block object and a second block object within a hardware description interface that is communicatively linked with the HLMS. Responsive to instantiating the first block object and the second block object, a first modeling block representing the first block object and a second modeling block representing the second block object can be created and displayed within the HLMS. Responsive to instantiating, within the hardware description interface, a signal object that is bound to an output port of the first block object and an input port of the second block object, a modeling line can be created and displayed within the HLMS that visually links an output of the first modeling block with an input of the second modeling block. The first modeling block, the second modeling block, and the modeling line can be stored as a circuit design.

Creating and displaying a modeling line can include automatically determining a parameter of the input port of the second xBlock object according to a parameter of the output port of the first xBlock object. The parameter may be, for example, data rate and/or signal type. The computer-implemented method further can include automatically propagating a parameter of an output port of the first xBlock object to an input port of the second xBlock object responsive to instantiating the xSignal object and binding the xSignal object to the output port of the first xBlock object and the input port of the second xBlock object.

One modeling block can be instantiated within the HLMS for each xBlock instantiated in the hardware description interface. For each xObject instantiated, circuit parameters can be distinguished from display parameters. The display parameters of each xObject can be encapsulated.

The computer-implemented method also can include automatically determining a layout for the circuit design within the HLMS that specifies a location of the first modeling block and a location of the second modeling block. At least one display parameter of the first xBlock object and the second xBlock object can be set according to the location of the first modeling block and the second modeling block respectively.

When the circuit design within the HLMS includes a feedback loop, the computer-implemented method can include automatically propagating one or more circuit parameter(s)

from a first xObject in the feedback loop to a second xObject within the feedback loop. The propagated circuit parameter(s) can be automatically assigned to modeling blocks within the HLMS that correspond to the first xObject and the second xObject respectively.

Another embodiment of the present invention can include a computer-implemented method of specifying a circuit design within a HLMS including instantiating a plurality of xObjects within a hardware description interface communicatively linked with the HLMS. A plurality of modeling objects corresponding to the plurality of xObjects can be automatically instantiated within the HLMS responsive to instantiation of the plurality of xObjects. An xSignal object can be bound to a source xObject and a load xObject of the plurality of xObjects. Responsive to binding the xSignal object, one or more circuit parameters can be automatically assigned, within the HLMS, to an input port of a modeling object corresponding to the load xObject according to a circuit parameter of an output port of a second modeling object corresponding to the source xObject. A description of the circuit design specifying modeling objects instantiated within the HLMS responsive to instantiation of the plurality of xObjects can be output.

The computer-implemented method can include, within at least one selected xObject, identifying a simulation model attribute indicating a type of simulation model to use when performing a simulation of the circuit design within the HLMS and, during simulation of the circuit design, selecting a simulation model for use in simulating a modeling object corresponding to the at least one selected xObject according to the simulation model attribute. The selected simulation model can be executed during the simulation.

The computer-implemented method can include automatically positioning modeling objects of the circuit design within the HLMS in a non-overlapping arrangement. Each xObject and corresponding modeling object can include at least one common circuit attribute and at least one common display attribute. Accordingly, the display attributes of each xObject can be encapsulated. In another aspect, the modeling object to which the at least one circuit parameter is automatically assigned need not be a child of the modeling object from which the at least one circuit attribute is determined.

Another embodiment of the present invention can include a computer program product including a computer-usable medium having computer-usable program code that specifies a circuit design within a HLMS. The computer-usable medium can include computer-usable program code that instantiates a plurality of xObjects within a hardware description interface communicatively linked with the HLMS, computer-usable program code that automatically instantiates a plurality of modeling objects corresponding to the plurality of xObjects within the HLMS responsive to instantiation of the plurality of xObjects, and computer-usable program code that binds an xSignal object to a source xObject and a load xObject of the plurality of xObjects. The computer-usable medium also can include computer-usable program code that, responsive to binding the xSignal object, automatically assigns, within the HLMS, at least one circuit parameter to an input port of a modeling object corresponding to the load xObject according to a circuit parameter of an output port of a second modeling object corresponding to the source xObject and computer-usable program code that outputs a description of the circuit design specifying modeling objects instantiated within the HLMS responsive to instantiation of the plurality of xObjects.

The computer-usable medium can include computer-usable program code that, within at least one selected xObject, identifies a simulation model attribute indicating a type of simulation model to use when performing a simulation of the circuit design within the HLMS and computer-usable program code that, during simulation of the circuit design, selects a simulation model for use in simulating a modeling object corresponding to the at least one selected xObject according to the simulation model attribute. Computer-usable program code that executes the selected simulation model during the simulation also can be included.

The computer-usable medium further can include computer-usable program code that automatically positions modeling objects of the circuit design within the HLMS in a non-overlapping arrangement. Each xObject and corresponding modeling object can include at least one common circuit attribute and at least one common display attribute. Accordingly, the computer-usable medium can include computer-usable program code that encapsulates the at least one display attribute of each xObject. The modeling object to which the at least one circuit parameter is automatically assigned need not be a child of the modeling object from which the at least one circuit attribute is determined.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed within this specification provide a high-level hardware description interface that can be used with a high-level modeling system (HLMS). In accordance with the embodiments disclosed within this specification, the hardware description interface, or "HDI," allows users to provide scripted inputs to dynamically create high-level modeling system descriptions within a HLMS having a graphical user interface (GUI). Use of the HDI allows users to create large, complex designs within the HLMS without having to manually drag-and-drop and position hundreds or thousands of different high-level modeling blocks within the graphical design environment. The HDI also facilitates the use and alteration of more complex and parameterizable modeling blocks within the HLMS design environment. Further advantages and benefits of the embodiments will be described in greater detail within this specification with reference to the accompanying figures.

Figure 1:
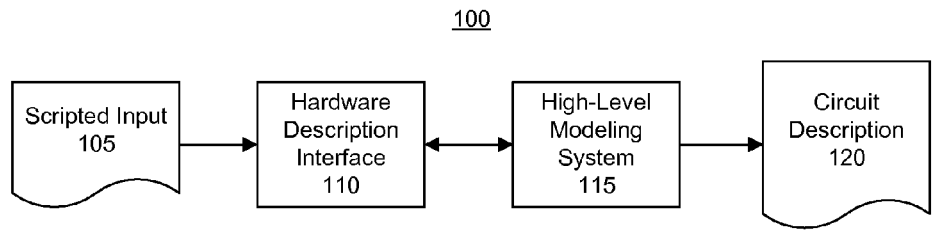
FIG. 1 is a first block diagram illustrating a system for specifying a circuit design within a high-level modeling system (HLMS) in accordance with one embodiment of the present invention.

FIG. 1 is a first block diagram illustrating a system 100 for specifying a system, for example, a circuit design, within a HLMS in accordance with one embodiment of the present invention. As shown, system 100 can include an HDI 110 and a HLMS 115. HDI 110 and HLMS 115 each may be implemented as a computer program executing within a suitable computer. Like numbers will be used to refer to the same items throughout this specification.

A "computer," also referred to as a "data processing system" or a "computer system," suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

HDI 110 provides a programming interface to HLMS 115. More particularly, HDI 110 provides a scripting interface to HLMS 115. In another embodiment, for example, HDI 110 can provide a non-scripting language interface. HDI 110 supports high-level data types as are supported in other high-level programming languages such as C++ and the like. HDI 110 can receive an input such as, e.g., a scripted input 105 and generate, or instantiate, one or more high-level objects referred to, e.g., as "xObjects" that are specified by scripted input 105. In general, responsive to an xObject being instantiated within HDI 110, HDI 110 in turn instructs HLMS 115 to instantiate a modeling object, that corresponds to the instantiated xObject, within the HLMS design environment. The modeling object is instantiated within the HLMS design environment without manual dragging-and-dropping the high-level modeling object. Further, the modeling block may be positioned, e.g., assigned a location within the HLMS design environment automatically by HDI 110.

As used herein, the letter "x" preceding any name will refer to a high-level object that can be instantiated within HDI 110. As such, objects instantiated within HDI 110 may be generally referred to as "xObjects." Specific examples of different types of xObjects that may be instantiated within HDI 110 can include "xBlocks," "xSignals," "xInports," and "xOutports." Within this specification, each respective type of xObject may be referred to with or without the term "object." For example, an xBlock may be referred to as either an "xBlock" or an "xBlock object."

Objects instantiated within HLMS 115 may be generally referred to as "modeling objects." Specific examples of modeling objects can include, for example, "modeling blocks" or "modeling lines." Modeling objects instantiated within HLMS 115 will not have the letter "x" preceding the name of the object. A modeling block generally refers to a high-level model of a particular function such as an adder, multiplier, or the like, which has a graphical representation that can be dragged into the HLMS design environment. A modeling line can refer to a high-level model of a signal or a wire linking two or more modeling blocks. A modeling line also will have a graphical representation that may be manipulated within HLMS 115 using a pointing device.

Within this specification, reference is made to instantiating a modeling object, whether a modeling block or a modeling line. It should be appreciated that when a modeling object is instantiated within HLMS 115, a graphical representation of that modeling object, e.g., a graphical block or a graphical line, will be displayed within the HLMS design environment. That graphical representation, and the underlying modeling object, will be assigned a particular location and further have connectivity with other modeling objects. Accordingly, throughout this specification, reference to a modeling object, whether a modeling block or a modeling line, can also refer to the graphical representation of that modeling object that is displayed within the HLMS design environment.

As noted, HDI 110 can receive scripted user input, e.g., scripted input 105. In one operational mode, scripted input 105 can be a script, within a file, specifying a portion of a system or an entire system, e.g., circuit design, to be implemented within HLMS 115. In that case, the scripted input 105 can be interpreted by HDI 110 with the particular xObjects specified by scripted input 105 being instantiated within HDI 110. In another operational mode, scripted input 105 can be provided through a command line interface included in HDI 110. In the command line operational mode, scripted inputs can be provided as individual commands in the command line interface. Responsive to selected scripted commands, appropriate xObjects can be instantiated within HDI 110. Scripted input 105 can be formatted in any of a variety of high-level scripting languages such as Tcl, Python, Ruby, proprietary scripting languages, or the like. Regardless of the particular scripting language used, scripted input 105 can be interpreted, e.g., executed without compilation.

HLMS 115 can be implemented as any of a variety of different systems from a variety of different circuit design, circuit modeling, and/or IC manufacturing companies. In one embodiment, HLMS 115 can be implemented as the Xilinx System Generator for Digital Signal Processing (DSP), also known as "SysGen." Simulink, which runs in MATLAB from The MathWorks, Inc., of Natick, Mass., is an interactive tool for modeling, simulating, and analyzing dynamical systems. SysGen is a high-performance design tool that executes as part of Simulink to provide a high-level, graphical modeling environment.

Circuit designs modeled within HLMS 115 can be stored or output as a circuit description 120. Circuit description 120 can be a programmatic circuit description implemented in any of a variety of different formats. For example, circuit description 120 can be formatted in mcode or another native format utilized by HLMS 115. HLMS 115 further can translate the circuit design modeled in the HLMS design environment using modeling objects into a different format. For example, HLMS 115 can output circuit description 120 as one or more hardware description language files, as a netlist, or the like. It should be appreciated that circuit description 120 further can be output to a bitstream generator that can translate circuit description 120 into a bitstream that can be loaded into a fully or partially programmable IC to configure the IC to implement the circuit design. As used herein, "outputting" and/or "output" can mean, for example, writing to a file, writing to a user display or other output device, playing audible notifications, sending or transmitting to another system, exporting, or the like.

Due to the graphical nature of most HLMSs, the various parameters relating to modeling objects include both circuit parameters and display parameters. Circuit parameters describe attributes of the modeling objects that influence the functionality of the modeling object within the HLMS design environment when included in a modeled system. For example, a circuit parameter can specify a delay for a modeling block, a signal type, a data type, and other circuit specific parameters. Display parameters describe attributes that control the graphical representation, e.g., the visualization, of the instantiated modeling object(s), e.g., size, color, onscreen location, etc., within the GUI of HLMS 115. While in some cases HLMS 115 may include limited scripting capabilities, typically, the user is exposed to all parameters, e.g., both circuit-related and display-related, of a modeling object. This makes it difficult to identify those circuit parameters of interest to the user as both circuit parameters and display parameters, which are unrelated circuit design implementation, are co-mingled and accessible to users within HLMS 115.

Accordingly, HDI 110 supports additional features such as encapsulation of display parameters of xObjects. In general, an xObject may have a one-to-one mapping of circuit parameters and display parameters with the modeling object represented by that xObject. Within the xObject, however, display parameters can be encapsulated. This means that a user will be unable to view any display parameters of an xObject. Different functions such as layout of modeling objects within HLMS 115 can be performed automatically by HDI 110, thereby eliminating the need to expose display parameters of xObjects to users.

In operation, a scripted input 105 can be provided to HDI 110. HDI 110 can receive scripted input 105 and instantiate xObjects as specified by scripted input 105. Responsive to instantiating each xObject, HDI 110 can instruct HLMS 115 to instantiate a corresponding modeling object within the HLMS design environment. With the circuit design being defined by the various modeling objects instantiated within HLMS 115, the HLMS 115 can output circuit description 120.

As noted, scripted input 105 provided to HDI 110 can be formatted in any of a variety of scripting languages. In general, scripted input 105 will specify constructors for implementing different instances of various classes of xObjects. The classes of xObjects that may be instantiated within HDI 110 include xBlock, xInport, xOutport, and xSignal. The various xObjects, once instantiated within HDI 110, will correspond to, and control, modeling objects within HLMS 115. For example, each xObject can communicate with its corresponding modeling object within HLMS 115 via an application programming interface (API) of HLMS 115.

The xBlock class is used to represent modeling blocks, e.g., functions, within HLMS 115. Accordingly, each xBlock object represents a modeling block, or subsystem, within HLMS 115. The xBlock constructor creates an xBlock object instance. An xBlock object can be created from a library block available within HDI 110 or can be a subsystem, e.g., an xObject that includes other xObjects. The xBlock constructor can be used to perform several different tasks such as adding a leaf block to the current system, adding a subsystem to the current system, or attaching a top-level system to a modeling block.

The xBlock constructor can have four arguments and can conform to the syntax xBlock=xBlock(source,parameters,inports,outports). When the source argument is a string, the string is expected to specify a modeling block name included within a modeling object library loaded within HLMS 115. When the source argument is a function handle, the source argument is interpreted as an HDI function. When the source argument is a MATLAB struct (structured array), the source argument can be treated as a configuration struct to specify how to attach the top-level to a modeling block.

The parameters argument defines the circuit parameters of the modeling block. The parameters argument can specify a cell array for position-based binding or a MATLAB struct for name-based binding. When the parameter is a modeling block within a loaded modeling block library, the parameter argument can be a cell array or a MATLAB struct. Otherwise, the parameter argument must be a cell array.

The inports and the outports arguments specify how input and output ports of the xBlock are bound. An inport of an xObject can serve as a signal destination, whereas an outport of an xObject can serve as a source of a signal. The binding can be a cell array for position-based binding or a MATLAB struct for name-based binding. When specifying an inport or an outport binding, an element of a cell array can be an xSignal object, an xInport object, or an xOutport object. When the port binding argument is a MATLAB struct, a field of the struct will be a port name of the modeling block, a value of the struct will be the modeling object to which the port is bound.

The inport and outport binding arguments are optional. If missing when constructing the xBlock object, the port binding can be specified through the bindPort method of an xBlock object. The bindPort method can be invoked using the statement block.bindPort(inports,outports), where inports and outports arguments specify the input port and the output port binding. When the xBlock constructor lacks the inport and outport arguments, the xBlock object is instantiated with only the source and parameter bindings.

The following are additional methods available in the xBlock class: names=block.getOutportNames will return a cell array of outport names for the xBlock. names=block.getInportNames will return a cell array of inport names for the xBlock. nin=block.getNumInports will return the number of inports of the xBlock. nout=block.getNumOutports will return the number of outports of the xBlock. insigs=block.getInSignals will return a cell array of incoming signals to the xBlock. outsigs=block.getOutSignals will return a cell array of outgoing signals from the xBlock.

The xInport class represents subsystem input ports within HLMS 115. That is, xInports are viewed from within the particular subsystem being created within HLMS 115. In this regard, an xInport can represent a source of a signal. Accordingly, an xInport object represents a subsystem input port. The constructor port can be used to create an xInport object and can have a syntax of port=xInport(port_name). The port constructor illustrated will create an xInport object with the name port_name. The constructor [port1,port2, port3, . . . ]=xInport(name1,name2,name3, . . . ) will create a list of xInport objects with the names name1, name2, name3, etc. The constructor port=xInport will create an xInport object with an automatically generated name. An xInport object can be passed from one xObject to another for port binding. The xInport object can include the method outsigs=port.getOutSignals which will return a cell array of outgoing signals from the xInport object.

The xOutport class represents subsystem output ports within HLMS 115. That is, xOutports are viewed from within the particular subsystem being created within HLMS 115. An xOutport can represent, for example, a destination of a signal. Accordingly, an xOutport object represents a subsystem output port. The constructor port can be used to create an xOutport object and can have a syntax of port=xOutport (port_name). The port constructor illustrated can create an xOutport object with the name port_name. The constructor [port1, port2, port3, . . . ]=xOutport(name1,name2, name3, . . . ) will create a list of xOutport objects with the names name1, name2, name3, etc. The constructor port=xOutport will create an xOutport object with an automatically generated name. An xOutport object can be passed from one xObject to another for port binding.

The xOutport object can include several methods. One method can be port.bind(obj), which will connect the object obj to port, where port is an xOutport object and obj is an xSignal object or an xInport object. The method insigs=port.getInSignals can return a cell array of incoming signals to the xOutport object.

The xSignal class represents signals within HLMS 115. An xSignal object can represent a signal and correspond to a modeling line within HLMS 115. The xSignal object connects sources to targets and can be instantiated using the constructor sig having the syntax sig=xSignal(sig_name). The constructor sig illustrated can create an xSignal object with the name sig_name. The constructor [sig1,sig2, sig3, . . . ]=xSignal(name1,name2,name3, . . . ) can create a list of xSignal objects with names name1, name2, name3, etc. The constructor sig=xOutport will create an xSignal object with an automatically generated name. An xSignal object can be passed from one xObject to another for port binding.

The xSignal object can include several methods. One method can be sig.bind(obj), which will connect the object obj to sig, where sig is an xSignal and obj is an xSignal object or xInport object. The method src=sig.getsrc can return a cell array of the source xObjects that are driving the xSignal object. The cell array can have, at most, one element. If the source is an input port, the source object will be an xInport object. If the source is an output port of a modeling block, the source object will be a struct, having the block field and the port field. The block field will be an xBlock object and the port field will be the port index. The method dst=sig.getDst can return a cell array of the destination objects that the xSignal object is driving. Each element can be either a MATLAB struct or an xOutport object having a port field and a block field.

Figure 2:
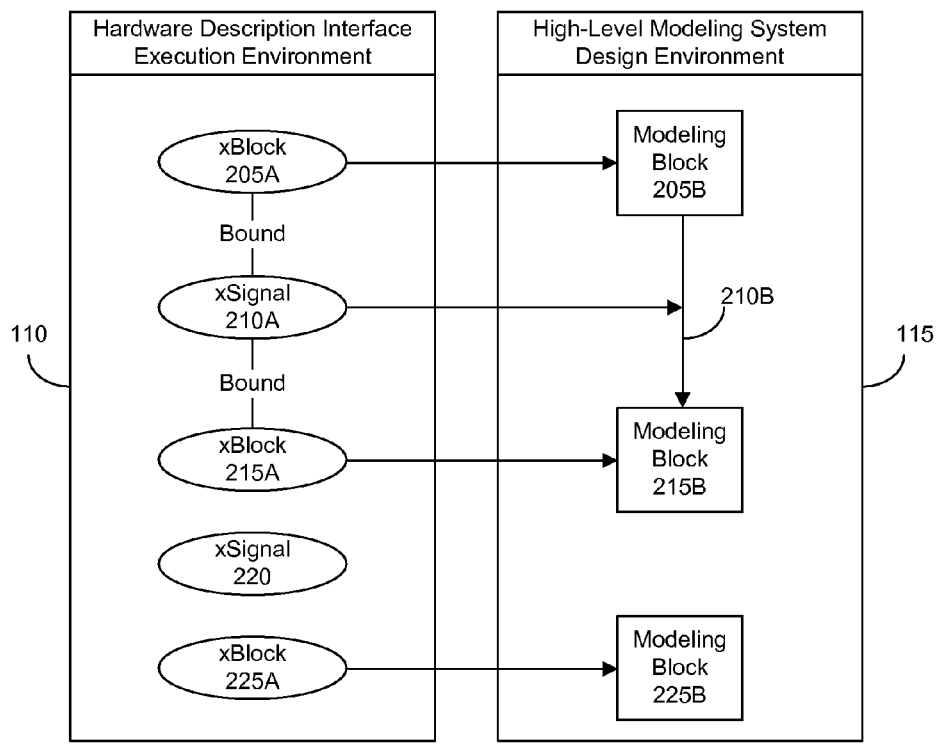
FIG. 2 is a second block diagram illustrating interoperation of the hardware description interface and HLMS described with reference to FIG. 1 in accordance with another embodiment of the present invention.

FIG. 2 is a second block diagram illustrating interoperation of HDI 110 and HLMS 115 in accordance with another embodiment of the present invention. FIG. 2 illustrates an execution environment, e.g., state of a computer system executing HDI 110 and HLMS 115. In general, in response to an input, HDI 110 instantiates block objects and signals. More specifically, as shown in FIG. 2, responsive to a scripted input, HDI 110 has instantiated xBlocks 205A, 215A, and 225A. HDI 110 further has instantiated xSignals 210A and 220.

Each instantiated xBlock can be a member of the xBlock class. The xBlock class is an abstract class used to represent modeling blocks within HLMS 115. For each xBlock that is instantiated, a corresponding modeling block is responsively, e.g., automatically, instantiated within HLMS 115. This creates a one-to-one relationship between each instantiated xBlock and each instantiated modeling block. As shown, instantiation of xBlock 205A causes instantiation of modeling block 205B. Instantiation of xBlock 215A causes instantiation of modeling block 215B. Instantiation of xBlock 225A causes instantiation of modeling block 225B. As noted, when a modeling block or a modeling line is instantiated within HLMS 115, a graphical representation of that modeling object can be displayed within a GUI of HLMS 115.

Each instantiated xBlock includes a plurality of circuit attributes. For example, each parameter available within a modeling block of HLMS 115, e.g., modeling block 205B, will have a like or same parameter within the corresponding xBlock, e.g., xBlock 205A. This is the case with regard to both circuit parameters and display parameters. Whereas display parameters of the modeling blocks are accessible to users of HLMS 115, such parameters are encapsulated within xBlocks within HDI 110. Any parameters determined or specified by an xObject can be automatically assigned, or propagated, to the modeling object corresponding to the xObject.

Each instantiated xSignal can be a member of the xSignal class, which is an abstract connector. The xSignal class is used to specify a connection between xBlocks instantiated within HDI 110, other xSignals, xInports, and xOutports. An xSignal object can bind to an input port or an output port of an xBlock. When an input port of an xBlock and a number of output ports of an xBlock are bound to an xSignal, a modeling line linking the corresponding modeling blocks within HLMS 115 can be instantiated. The modeling line can be automatically generated, e.g., instantiated, and displayed within HLMS 115.

Referring to FIG. 2, for purposes of illustration, it can be assumed that xSignal 210A has been bound to an output port of xBlock 205A and an input port of xBlock 215A. When xSignal 210A is instantiated and bound to two or more endpoints, in this example two xBlocks, a modeling line can be responsively instantiated and displayed within HLMS 115 that connects the endpoints. Accordingly, modeling line 210B is automatically drawn connecting modeling blocks 205B and 215B, e.g., those modeling blocks corresponding to xBlocks 205A and 215A respectively.

By comparison, xSignal 220, though instantiated within HDI 110, is not bound to any endpoints. In that case, without being bound, instantiation of xSignal 220 will not cause any modeling line to be instantiated within HLMS 115. Once xSignal 220 is bound to at least two different xObjects, a modeling line corresponding to xSignal 220 will be instantiated within HLMS 115.

In another aspect, xSignals may be bound together. Binding two or more selected xSignals together is equivalent to connecting all input ports of the bound xSignals together with a physical line and connecting all output ports of the bound xSignals together with a physical line. Any further binding to the selected xSignal objects will continue to connect to this physical line. This means that multiple xSignal objects that have been bound together may be represented by a single modeling line within HLMS 115. As such, a one-to-one correspondence between xSignal objects and modeling lines is not always the case. The use of abstract connectors and the ability to bind xSignal objects in this manner allows an xSignal object that is returned from a particular function to be bound to other input ports and output ports of xBlocks or other xSignal objects to form a larger system.

Another feature supported within HDI 110 is the ability to propagate data rate and data type from one xBlock to another. A user, for example, may specify a fixed-point data type for a given output port of an xBlock, e.g., a driver xBlock. When the output port of the driver xBlock is connected to an input port of another xBlock, e.g., a load xBlock, via an xSignal, data rate and data type of the output port of the driver xBlock can be automatically propagated, e.g., attributed or assigned, to the input port of the load xBlock. This propagation of data rate and data type may also be propagated through feedback loops where the relationship between xObjects in HDI 110 (or corresponding modeling blocks within HLMS 115) is not parent to child as is the case with typical inheritance of parameters in high-level programming languages.

The ability to propagate data rate and data type provides significant benefits over HDLs such as Verilog and VHDL. In general, within a HDL, the data rate and data type must be explicitly specified for each input port and/or output port. Further, HDLs allow parameter passing through generics. Generic-based parameter passing supports only the passing of parameters from a parent object to other objects beneath the parent object, e.g., child objects. This means that the passing of a generic within a HDL description of a circuit design is unable to pass a parameter along a feedback path as the direction is not parent-to-child. At some point within the feedback path the child must pass a parameter back to the parent, which is not permitted in HDL system representations.

By supporting propagation of parameters between bound objects in any direction, e.g., not just parent-to-child, HDI 110 facilitates design of adaptive controlling and filtering systems with feedback loops and complicated data flow graphs. Automatic data rate and data type propagation also allows users to incorporate parameterized designs that automatically adapt to the data rate and data type of signals connected to the input ports and output ports of those xObjects. For example, responsive to changing a circuit parameter of an xBlock that represents a parameterized IP core, that change can be propagated to the corresponding modeling block within HLMS 115. Further, any changes in terms of data rate and/or data type with respect to the xBlock may be automatically propagated to other xBlocks connected via xSignal objects. These changes occur automatically within the HDI design environment, and thus, are automatically propagated to the corresponding modeling objects within the HLMS design environment, without the user having to manually change any xObjects connected to the xBlock with the now changed parameterization.

Figure 3:
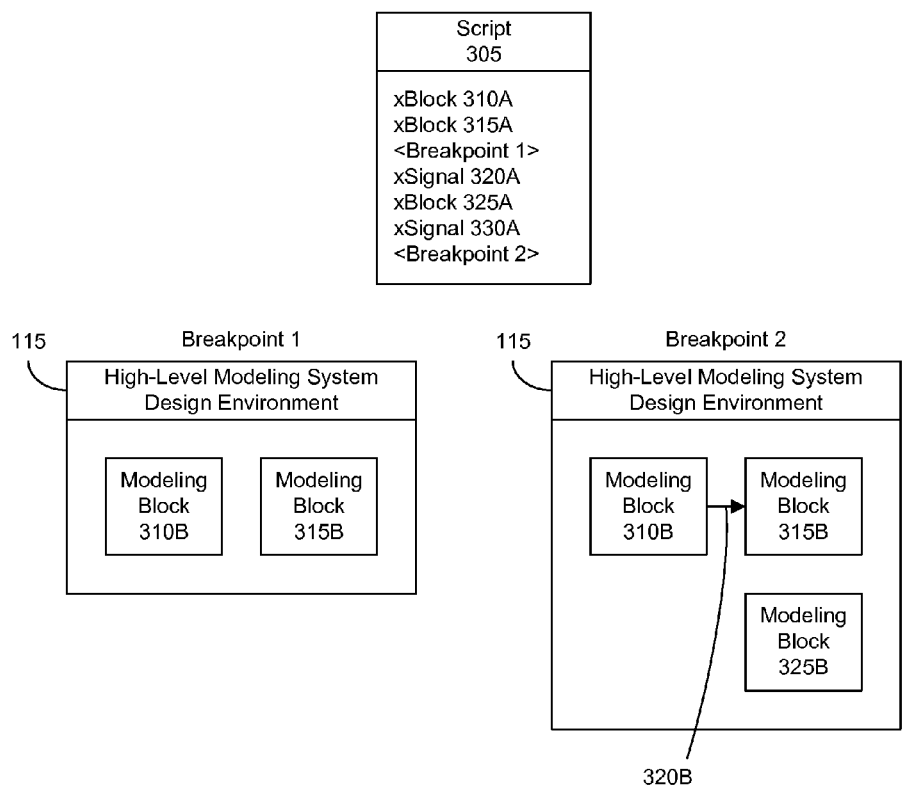
FIG. 3 is a third block diagram illustrating a method of specifying a circuit design within the HLMS in accordance with another embodiment of the present invention.

FIG. 3 is a third block diagram illustrating a method of specifying a circuit design within the HLMS 115 in accordance with another embodiment of the present invention. FIG. 3 illustrates the state of the design environment within HLMS 115 as a scripted input, e.g., script 305, is processed by HDI 110. The views presented in FIG. 3 are intended to illustrate contents of the GUI of HLMS 115 at various stages of execution of script 305.

As shown, script 305 includes two different breakpoints referred to as breakpoint 1 and breakpoint 2. Execution of script 305 by HDI 110 up to breakpoint 1 causes HDI 110 to instantiate xBlocks 310A and 315A. Accordingly, when breakpoint 1 is encountered, the HLMS design environment will have instantiated and displayed a modeling block 310B, corresponding to xBlock 310A, and a modeling block 315B, corresponding to xBlock 315A. When the execution of script 305 is stopped at breakpoint 1, users can immediately inspect the visualization of the system being developed within HLMS 115 as pictured.

Continued execution of script 305 from breakpoint 1 to breakpoint 2 will cause HDI 110 to instantiate xSignal 320A. For purposes of illustration, it can be assumed that xSignal 320A is bound to an output port of xBlock 310A and an input port of xBlock 315A. HDI 110 further will instantiate xBlock 325A and xSignal 330A. In this example, it can be assumed that xSignal 330A is not yet bound to any xBlocks. Accordingly, when breakpoint 2 is encountered, HLMS 115 will have instantiated and displayed modeling line 320B corresponding to xSignal 320A. As shown, modeling line 320B connects modeling blocks 310B and 315B, which correspond to xBlocks 310A and 315A respectively. HLMS 115 further will have instantiated modeling block 325B, which corresponds to xBlock 325A. Since xSignal 330A has not been bound to any input ports or output ports, no corresponding modeling line has been instantiated or displayed within HLMS 115.

FIG. 3 illustrates one technique for users to supervise and inspect the system being developed within HLMS 115 at various stages. By setting breakpoints at desired locations within scripted inputs, the state of the system within HLMS 115 can be visually inspected. This allows users to view the system at various stages of development without having to view all modeling blocks or modeling lines of the system, which, as noted, may number in the thousands.

FIG. 3 also illustrates the automatic layout functionality of HDI 110. In addition to specifying connectivity of modeling blocks within HLMS 115, HDI 110 further will automatically control layout and visualization of the circuit design being implemented within HLMS 115. As noted, display parameters of the various xObjects are encapsulated, thereby relieving the user from having to navigate the many parameters of xObjects that are unrelated to circuit design. Encapsulation is facilitated through the automatic layout of the visualization within HLMS 115. The modeling blocks instantiated within HLMS 115 can be positioned automatically so that no modeling block overlaps any other modeling block. The display parameters, e.g., coordinates of each modeling block within HLMS 115, though present in the corresponding xBlock, are hidden from the user through encapsulation.

The automatic layout function relieves users from manually dragging modeling objects to desired locations to explicitly specify location of each modeling object. Without automatic layout, this manual positioning is necessary to avoid overlap of modeling blocks, which would make visual inspection of the system within HLMS 115 cumbersome. Automatic layout allows users to focus on functionality rather than visualization. Within the HLMS 115, however, users still have the ability to inspect the visualized design, e.g., through viewing the HLMS design environment and/or using breakpoints as described.

It should be appreciated that a user may manually move or relocate modeling objects, e.g., modeling block 310B, within HLMS 115. In that case, the communication link between HDI 110 and HLMS 115 can ensure that the display parameters of xBlock 310A, e.g., those related to position, will be updated to reflect the new location or coordinates of modeling block 310B after the manual movement by the user. In this regard, it should be appreciated that xObject parameters updated or edited can be pushed to the corresponding modeling object and stored therein. Similarly, parameters altered in modeling objects can be pushed back to, and updated within, the corresponding xObjects.

In another aspect, HDI 110 provides users with the ability to query and traverse circuit design within HLMS 115. More particularly, through the HDI 110, a user may query various settings of one or more modeling objects instantiated to form the circuit design within HLMS 115. The connectivity among modeling objects may be traversed. For example, a user may issue a command querying one or more settings of an instantiated xBlock. Parameters retrieved for the xBlock will correspond, e.g., be the same as, the parameters of the modeling block instantiated within HLMS 115 that corresponds to the queried xBlock. This allows users to query for the number of input ports of a given modeling block, the number of output ports of a given modeling block, the data types and the data rates of each of the input and/or output ports, and which other input and/or output ports of other modeling blocks are connected to the input and/or output ports of the subject modeling block being queried. The query may be specified as scripted input, e.g., provided through the command line interface of HDI 110.

For a system that is already created within HLMS 115, whether by hand, e.g., graphically, or using HDI 110, users can use the top-level block handle to construct an xBlock object and then use a traversal API of the HDI 110 to traverse into the system within HLMS 115. Using the traversal API, users may, as noted, traverse the connectivity of modeling blocks within HLMS 115 as well as locate particular modeling blocks that have some desired parameter. Other solutions are incapable of operating upon an existing system within HLMS 115 and, instead, may only be used to create a system within HLMS 115. The tight integration and two-way communication between HDI 110 and HLMS 115 allows the circuit design within the HLMS 115 to be read and replicated through xObjects within HDI 115. Once the circuit design is represented using xObjects within HDI 115, modification of the circuit design within HLMS 115 can be performed via various functions of HDI 110 which operate on xObjects and propagate such changes to HLMS 115.

Accordingly, HDI 110 also can include design modification functions. For example, similar to the traversal API previously discussed, a user can instantiate an xBlock using a top-level block handle of a model block within HLMS 115. Using the xBlock object, a user can modify the connectivity of modeling blocks inside the top-level model block. Examples of different modifications that can be performed in this manner include, but are not limited to, adding modeling blocks or modeling lines to the circuit design being developed within HLMS 115, removing modeling blocks or modeling lines from the circuit design being developed within HLMS 115, changing connectivity of the modeling lines among the modeling blocks of the circuit design being developed within HLMS 115, and changing parameters of model blocks of the circuit design being developed. For example, the latency of a modeling block can be changed. A data rate and/or a data type of a port of an xBlock can be changed, which will cause that change to be automatically propagated through to other xObjects bound to the changed port of the xBlock and, in turn, propagated to corresponding modeling objects within HLMS 115.

The function x1sub2script is a helper function that can convert a system from within HLMS 115 into a top level script. The argument of x1sub2script may also be a modeling block, e.g., to convert a modeling block to a script. This utility function allows one to create a circuit design within HLMS 115 graphically and then generate a corresponding scripted input specifying that function that may be processed by HDI 110, as noted. For example, the statement x1sub2script (block) will print out the xBlock call that creates the block. In this manner, an xObject representation for an existing circuit design within the HLMS 115 can be generated. Once generated, the xObject circuit design representation can be manipulated as described within this specification.

In yet another aspect, xBlock objects can include a parameter that specifies which simulation engine will be used to model or emulate the circuit function represented by the xBlock within HLMS 115. For example, an xBlock that performs addition and subtraction operations can include a parameter whose value indicates whether, during simulation within HLMS 115, the embedded HLMS model will be used, e.g., a SysGen M code simulation model, whether a HDL simulation model will be used, another programmatic model will be used, or whether actual hardware will be used through hardware co-simulation. This allows a high-level of granularity in defining how simulation of a given system will be performed or executed on a per xObject, e.g., a per modeling object, basis.

As a system is simulated within HLMS 115, the various xObjects corresponding to that system will be updated with appropriate values. This is accomplished through the integration between HLMS 115 and HDI 110. Each of the xObjects can include a display method. The display method, when executed, will output values of the subject xObject. For example, the display method can output input port values of an xObject or output port values of an xObject. It should be appreciated that the value of an output port or an input port also reflects the value of the xSignal object that is bound to the particular port being displayed. The display method can be invoked once each cycle of simulation or on particular cycles of the simulation. The values that are output may be displayed in a console view or saved within a log file, for example. A user may also use a scooping tool to view a waveform representation of the values obtained.

In another aspect, a scripted user input, as described herein, can be associated with a mask initialization function of a Simulink masked subsystem. When a user manually places the masked subsystem into a circuit design within the graphical design environment of the HLMS, the associated script can be automatically invoked during design compilation to construct the design portion under the mask subsystem. For example, a script can be embedded within the mask initialization function of a Simulink subsystem. In this manner, a parameterized design can be automatically generated within the HLMS based upon user specified parameters and the rates and types of input data as the script is processed.

Figure 4:
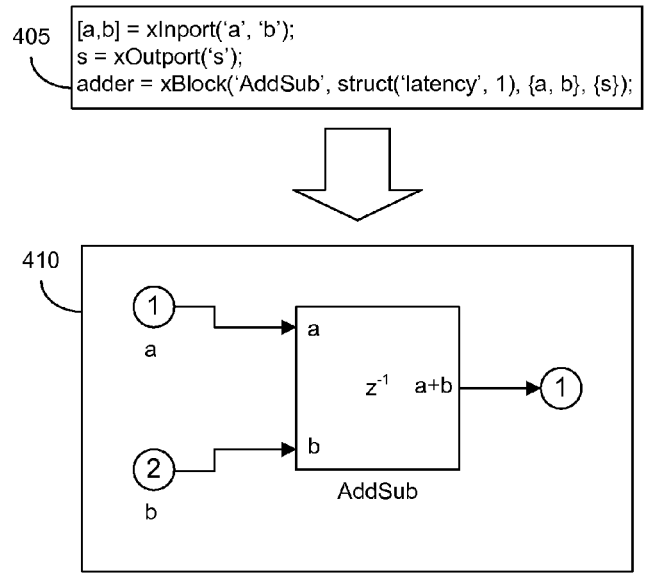
FIG. 4 is a fourth block diagram illustrating a method of creating a circuit design within the HLMS in accordance with another embodiment of the present invention.

FIG. 4 is a fourth block diagram illustrating a method of specifying a circuit design within HLMS 115 in accordance with another embodiment of the present invention. Scripted input 405 can be provided to HDI 110. As noted, scripted input 405 can be input line-by-line, e.g., through a command line, or as a file. In any case, processing scripted input 405 within HDI 110 instantiates circuit design 410 within HLMS 115. In this example, when HLMS 115 is implemented using SysGen as described, scripted input 405 will generate circuit design 410, which includes an adder block having a latency of one. Responsive to instructions from HDI 110, HLMS 115 will further generate input ports "a" and "b" for the subsystem according to the xInport constructor and an output port "s" for the subsystem according to the xOutport constructor. Input ports "a" and "b" source the output port "s." The "AddSub" parameter can be mapped to, or otherwise indicate, a particular block inside a library of HLMS 115 that has been loaded.

Figure 5:
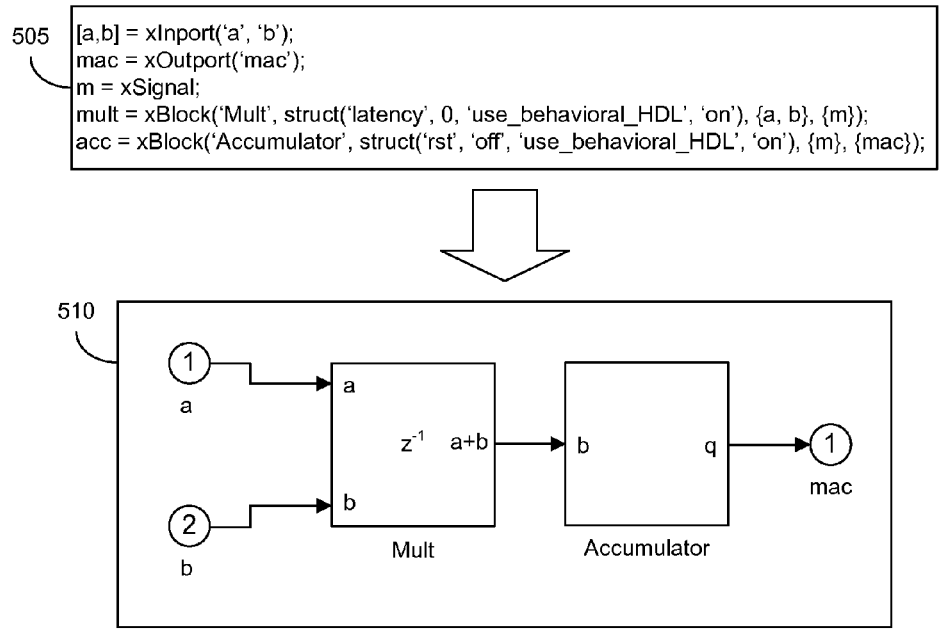
FIG. 5 is a fifth block diagram illustrating a method of specifying a circuit design within the HLMS in accordance with another embodiment of the present invention.

FIG. 5 is a fifth block diagram illustrating a method of specifying a circuit design within HLMS 115 in accordance with another embodiment of the present invention. Scripted input 505 can be provided to HDI 110. Processing scripted input 505 within HDI 110 will instantiate circuit design 510 within HLMS 115. In this example, scripted input 505 directs HLMS 115 to generate behavioral HDL. As shown, the xInport constructor generates subsystem input ports "a" and "b." The xOutport constructor generates the subsystem output port "mac." FIGS. 4 and 5 further illustrate the automatic layout functionality of HDI 110.

Figure 6:
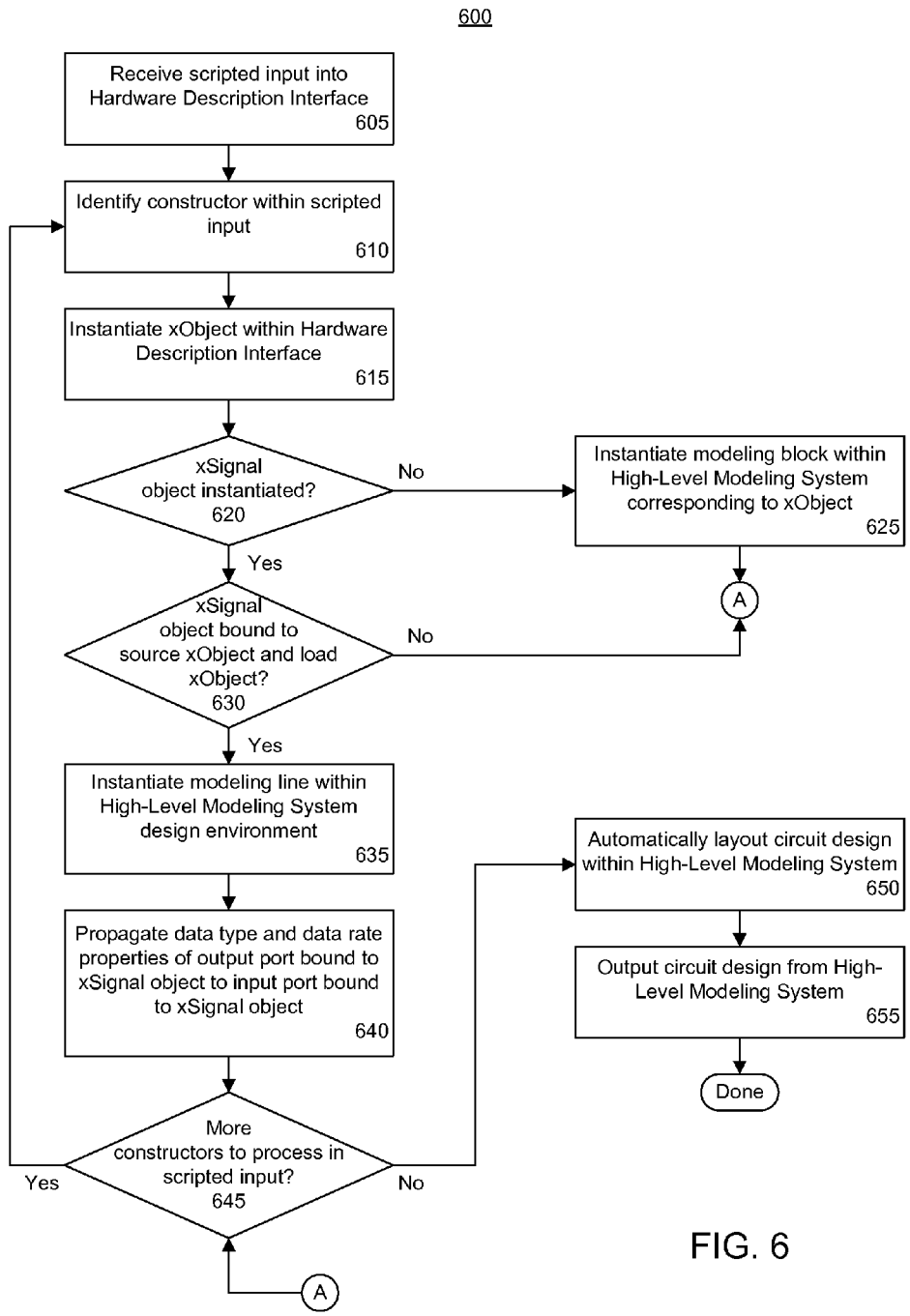
FIG. 6 is a flow chart illustrating a method of creating a circuit design within a HLMS in accordance with another embodiment of the present invention.

FIG. 6 is a flow chart illustrating a method 600 of creating a system, such as a circuit design, within a HLMS in accordance with another embodiment of the present invention. Method 600 presents a simplified example of several higher level functions that can be implemented using an HDI and a HLMS as described with reference to FIGS. 1-5 of this specification. As such, method 600 is not intended to limit the embodiments disclosed within this specification by virtue of excluding more complex features or functions already described. Method 600 can begin in a state where both the HDI and the HLMS are executing. In this example, the scripted input can be provided in the form of a script file. However, in other embodiments, the scripted input can be individual commands, or alternatively, the input can be a non-scripting language.

Accordingly, in step 605, the HDI can receive the scripted input. In step 610, the HDI can identify a constructor within the scripted input. In step 615, the HDI can instantiate the xObject specified by the constructor. In step 620, a determination can be made as to whether the xObject that was instantiated in step 615 was an xSignal object. If so, the method can continue to step 630. If not, the method can proceed to step 625.

In step 625, a modeling object corresponding to the instantiated xObject can be instantiated within the HLMS. The method can then proceed to step 645. In step 630, where the xObject that was instantiated was an xSignal object, a determination can be made as to whether the xSignal was bound to a source xObject and a load xObject. If so, the method can proceed to step 635 where a modeling line corresponding to the instantiated xObject can be instantiated in the HLMS. If not, the method can continue to step 645 to continue processing further constructors from the scripted input.

Continuing with step 640, data type parameter(s) and data rate parameter(s) of the source xObject can be propagated, or assigned, to the load xObject for the instantiated xSignal object. As noted, this propagates the parameters from the corresponding source modeling object to the corresponding load modeling object within the HLMS. In step 645, a determination can be made as to whether further constructors remain to be processed within the scripted input. If so, the method can loop back to step 610 and continue processing. If not, the method can continue to step 650 where the layout of the various modeling blocks instantiated within the HLMS design environment can be performed automatically. It should be appreciated that while the automatic layout function is illustrated at the conclusion of execution of the scripted input, xObjects and modeling objects can be positioned as the xObjects and modeling objects are instantiated. Further, the layout may be revised or adjusted, e.g., modeling objects repositioned, as execution of the scripted input continues.

As positioning parameters of different modeling objects are determined, those positioning parameters, e.g., a subset of the display parameters, can be automatically propagated to the HDI and written to each respective xObject, though such attributes are encapsulated from the user. In step 655, a description of the system created within the HLMS can be output.

As noted, method 600 has been presented for purposes of illustration only. Additional steps relating to instantiation of xInports, instantiation of xOutports, setting breakpoints, modifying the system within the HLMS, traversing the system within the HLMS, and the like, though not illustrated in FIG. 6, may be included.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a serviette, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of specifying a circuit design within a high-level modeling system, the method comprising:
responsive to a scripted user input, instantiating, using a processor, a first block object and a second block object within a hardware description interface that is communicatively linked with the high-level modeling system, wherein the first block object and the second block object each is implemented as a high-level object including at least one method;
responsive to instantiating the first block object and the second block object, creating and displaying within the high-level modeling system, a first modeling block representing the first block object and a second modeling block representing the second block object;
responsive to instantiating, within the hardware description interface, a signal object that is bound to an output port of the first block object and an input port of the second block object, creating and displaying a modeling line within the high-level modeling system that visually links an output of the first modeling block with an input of the second modeling block, wherein the signal object is implemented as a high-level object including the at least one method;
wherein the first block object is a first xBlock object, the second block object is a second XBlock object, and the signal object is an xSignal object;
for each xObject instantiated, distinguishing between circuit parameters and display parameters; and
encapsulating the display parameters of each xObject; and
storing the first modeling block, the second modeling block, and the modeling line as the circuit design.

2. The method of claim 1, wherein creating and displaying the modeling line further comprises automatically determining a parameter of the input port of the second block object according to a parameter of the output port of the first block object.

3. The method of claim 2, further comprising selecting the parameter to be a signal type or a data rate.

4. The method of claim 1, further comprising automatically propagating a parameter of an output port of the first xBlock object to an input port of the second xBlock object responsive to instantiating the xSignal object and binding the xSignal object to the output port of the first xBlock object and the input port of the second xBlock object.

5. The method of claim 1, wherein the first block object and the second block object have a one-to-one correspondence of circuit parameters and display parameters with the first modeling block and the second modeling block respectively.

6. The computer implemented method of claim 1, further comprising automatically determining a layout for the circuit design within the high-level modeling system comprising a location of the first modeling block and a location of the second modeling block.

7. The method of claim 6, further comprising:
responsive to a user input received as a command line entry, querying at least one of the first block object, the second block object, or the signal object for a parameter specified by the command line entry; and
displaying the parameter.

8. The method of claim 1, wherein the circuit design within the high-level modeling system comprises a feedback loop, the method further comprising automatically propagating at least one circuit parameter from a first xObject in the feedback loop to a second xObject within the feedback loop, wherein the at least one circuit parameter is automatically assigned to modeling blocks within the high-level modeling system that correspond to the first xObject and the second xObject respectively.

9. A method of specifying a circuit design within a high-level modeling system, the method comprising:
instantiating, using a processor, a plurality of xObjects within a hardware description interface communicatively linked with the high-level modeling system responsive to a scripted input, wherein each xObject is implemented as a high-level object including at least one method;
automatically instantiating a plurality of modeling objects corresponding to the plurality of xObjects within the high-level modeling system responsive to instantiation of the plurality of xObjects;
binding an xSignal object to a source xObject and a load xObject of the plurality of xObjects, wherein the xSignal is a high-level object including the at least one method;
responsive to binding the xSignal object, automatically assigning, within the high-level modeling system, at least one circuit parameter to an input port of a modeling object corresponding to the load xObject according to a circuit parameter of an output port of a second modeling object corresponding to the source xObject;
wherein the circuit parameter is a data type or a data rate; and
outputting a description of the circuit design comprising modeling objects instantiated within the high-level modeling system responsive to instantiation of the plurality of xObjects.

10. The method of claim 9, further comprising:
within at least one selected xObject, identifying a simulation model attribute indicating a type of simulation model to use when performing a simulation of the circuit design within the high-level modeling system;
during simulation of the circuit design, selecting a simulation model for use in simulating a modeling object corresponding to the at least one selected xObject according to the simulation model attribute; and
executing the selected simulation model during the simulation.

11. The method of claim 9, further comprising automatically positioning modeling objects of the circuit design within the high-level modeling system in a non-overlapping arrangement.

12. The method of claim 9, wherein each xObject and corresponding modeling object comprise at least one common circuit attribute and at least one common display attribute, the method further comprising encapsulating the at least one display attribute of each xObject.

13. The method of claim 9, wherein the modeling object to which the at least one circuit parameter is automatically assigned is not a child of the modeling object from which the at least one circuit attribute is determined.

14. A computer program product comprising:
a non-transitory computer-usable medium comprising computer-usable program code that specifies a circuit design within a high-level modeling system, the computer-usable medium comprising:
computer-usable program code that instantiates a plurality of xObjects within a hardware description interface communicatively linked with the high-level modeling system responsive to a scripted input, wherein each xObject is implemented as a high-level object including at least one method;

computer-usable program code that automatically instantiates a plurality of modeling objects corresponding to the plurality of xObjects within the high-level modeling system responsive to instantiation of the plurality of xObjects;

computer-usable program code that binds an xSignal object to a source xObject and a load xObject of the plurality of xObjects wherein the xSignal is a high-level object including the at least one method;

computer-usable program code that, responsive to binding the xSignal object, automatically assigns, within the high-level modeling system, at least one circuit parameter to an input port of a modeling object corresponding to the load xObject according to a circuit parameter of an output port of a second modeling object corresponding to the source xObject;

wherein the circuit parameter is a data type or a data rate; and computer-usable program code that outputs a description of the circuit design comprising modeling objects instantiated within the high-level modeling system responsive to instantiation of the plurality of xObjects.

15. The computer program product of claim 14, wherein the computer-usable medium further comprises:

computer-usable program code that, within at least one selected xObject, identifies a simulation model attribute indicating a type of simulation model to use when performing a simulation of the circuit design within the high-level modeling system;

computer-usable program code that, during simulation of the circuit design, selects a simulation model for use in simulating a modeling object corresponding to the at least one selected xObject according to the simulation model attribute; and computer-usable program code that executes the selected simulation model during the simulation.

16. The computer program product of claim 14, wherein the computer-usable medium further comprises computer-usable program code that automatically positions modeling objects of the circuit design within the high-level modeling system in a non-overlapping arrangement.

17. The computer program product of claim 14, wherein each xObject and corresponding modeling object comprise at least one common circuit attribute and at least one common display attribute, wherein the computer-usable medium further comprises computer-usable program code that encapsulates the at least one display attribute of each xObject.

18. The computer program product of claim 14, wherein the modeling object to which the at least one circuit parameter is automatically assigned is not a child of the modeling object from which the at least one circuit attribute is determined.

* * * * *